(12) United States Patent
Dunklee et al.

(10) Patent No.: US 6,861,856 B2
(45) Date of Patent: Mar. 1, 2005

(54) GUARDED TUB ENCLOSURE

(75) Inventors: John Dunklee, Tigard, OR (US); Greg Norgden, Logan, UT (US); C. Eugene Cowan, Beaverton, OR (US)

(73) Assignee: Cascade Microtech, Inc., Beaverton, OR (US)

( * ) Notice: Subject to any disclaimer, the term of this patent is extended or adjusted under 35 U.S.C. 154(b) by 0 days.

(21) Appl. No.: 10/319,287

(22) Filed: Dec. 13, 2002

(65) Prior Publication Data
US 2004/0113639 A1 Jun. 17, 2004

(51) Int. Cl.⁷ .............................................. G01R 31/02
(52) U.S. Cl. ....................................................... 324/754
(58) Field of Search ............................. 324/158.1, 760, 324/765, 754, 761, 755

(56) References Cited

U.S. PATENT DOCUMENTS

| | | | |
|---|---|---|---|
| 5,220,277 A | 6/1993 | Reitinger | 324/158 F |
| 5,278,494 A | 1/1994 | Obigane | 324/158 F |
| 5,486,975 A | 1/1996 | Shamouilian et al. | 361/234 |
| 5,517,111 A | 5/1996 | Shelor | 324/235 |
| 5,561,585 A | 10/1996 | Barnes et al. | 361/234 |
| 5,572,398 A | 11/1996 | Federlin et al. | 361/234 |
| 5,668,470 A | 9/1997 | Shelor | 324/202 |
| 5,828,225 A | 10/1998 | Obikane et al. | 324/758 |
| 5,835,997 A * | 11/1998 | Yassine | 324/754 |
| 5,963,027 A | 10/1999 | Peters | 324/158.1 |
| 6,002,263 A | 12/1999 | Peters et al. | 324/754 |
| 6,043,667 A | 3/2000 | Cadwallader et al. | 324/758 |
| 6,111,419 A | 8/2000 | Lefever et al. | 324/754 |
| 6,194,907 B1 | 2/2001 | Kanao et al. | 324/760 |
| 6,424,141 B1 * | 7/2002 | Hollman et al. | 324/158.1 |

* cited by examiner

*Primary Examiner*—Evan Pert
*Assistant Examiner*—Tung X. Nguyen
(74) *Attorney, Agent, or Firm*—Chernoff, Vilhauer, McClung & Stenzel, LLP (57) ABSTRACT

A probe station with an improved guarding structure.

21 Claims, 11 Drawing Sheets

GUARDED TUB ENCLOSURE

BACKGROUND OF THE INVENTION

The present invention relates to a guarding structure for a probe station.

Probe stations are designed to measure the characteristics of electrical devices such as silicon wafers. Probe stations typically include a chuck that supports the electrical device while it is being probed by needles or contacts on a membrane situated above the chuck. In order to provide a controlled environment to probe the electrical device, many of today's probe stations surround the chuck with an environmental enclosure so that temperature, humidity, etc. may be held within predetermined limits during testing. Environmental enclosures protect the device from spurious air currents that would otherwise affect measurements, and also facilitate thermal testing of electrical devices at other-than-ambient environmental conditions. Environmental conditions within the enclosure are principally controlled by a dry air ventilation system as well as a temperature element, usually located below the chuck, that heats or cools the electrical device being tested through thermal conduction.

Many probe stations also incorporate guarding and electromagnetic interference (EMI) shielding structures within or around the environmental enclosures in order to provide an electrically quiet environment, often essential during high frequency testing where electrical noise from external electromagnetic sources can hinder accurate measurement of the electrical device's characteristics. Guarding and EMI shielding structures are well known and discussed extensively in technical literature. See, for example, an article by William Knauer entitled "Fixturing for Low Current/Low Voltage Parametric Testing" appearing in Evaluation Engineering, November, 1990, pages 150–153.

Probe stations incorporating EMI shielding structures will usually at least partially surround the test signal with a guard signal that closely approximates the test signal, thus inhibiting electromagnetic current leakage from the test signal path to its immediately surrounding environment. Similarly, EMI shielding structures may include interconnecting a shield potential to the environmental enclosure surrounding much of the perimeter of the probe station. The environmental enclosure is typically connected to earth ground, instrumentation ground, or some other desired potential.

To provide guarding and shielding for systems of the type just described, existing probe stations may include a multistage chuck upon which the electrical device rests when being tested. The top stage of the chuck, which supports the electrical device, typically comprises a solid, electrically conductive metal plate through which the test signal may be routed. A middle stage and a bottom stage of the chuck similarly comprise solid electrically conductive plates through which a guard signal and a shield signal may be routed, respectively. In this fashion, an electrical device resting on such a multistage chuck may be both guarded and shielded from below.

Figure 1:
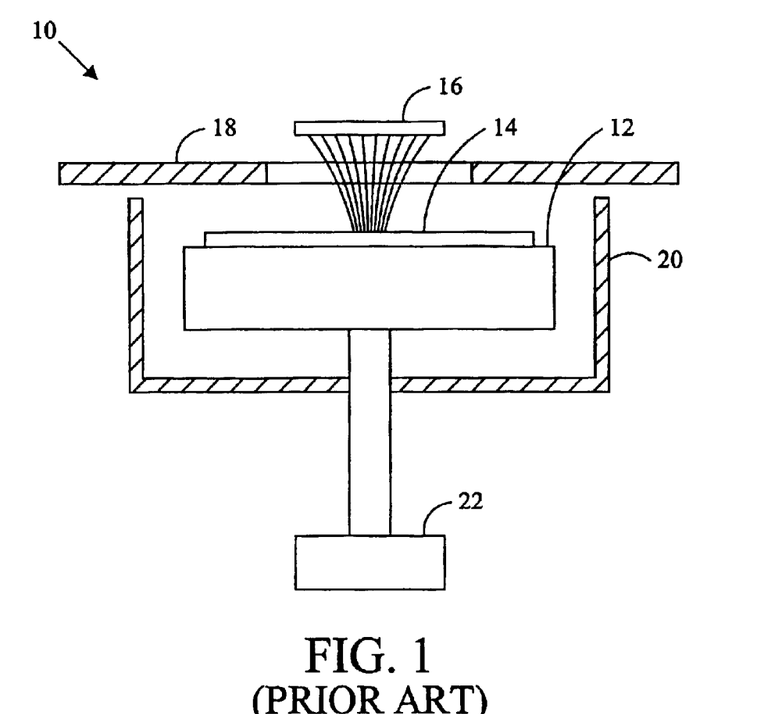
FIG. 1 shows a cross sectional view of an existing probe station that includes a tub enclosure.

FIG. 1 shows a generalized schematic of an existing probe station. A probe station 10 includes a chuck 12 that supports an electrical device 14 to be probed by a probe apparatus 16 supported by a platen 18 located above the chuck 12. The chuck is fixedly and/or rigidly interconnected with a tub enclosure 20. The enclosure 20 may be conductive and electrically connected to a guard signal, shield signal, ground signal, or floating. The tub enclosure 20 at least partially surrounds the chuck 12, and hence the electrical device 14.

Multiple electrical devices contained on a silicon wafer may be successively positioned below the probe apparatus 16 for testing by moving the combination of the tub enclosure 20 and chuck 12 laterally. A positioner 22, typically located below the tub enclosure 20, may provide vertical, lateral and/or angular adjustments of the chuck 12. Because the chuck 12 does not move laterally with respect to the tub enclosure 20, the size of the tub enclosure 20 may closely surround the chuck 12, facilitating efficient control of the environment immediately surrounding the chuck 12.

Figure 2:
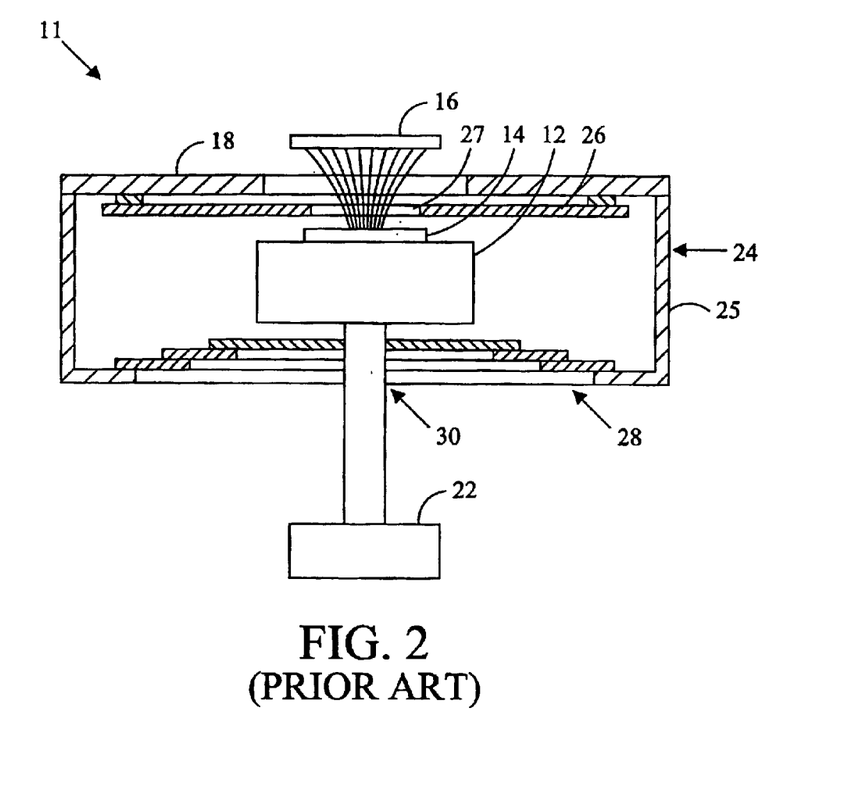
FIG. 2 shows a cross sectional view of an existing probe station that includes an outer shield box.

FIG. 2 shows a generalized schematic of another probe station 11. Referring to FIG. 2, where numerals common with FIG. 1 represent similar elements that perform similar functions, the probe station 11 includes the chuck 12 that supports the electrical device 14 to be probed by the probe apparatus 16 that extends through an opening in the platen 18. Rather than enclosing the chuck 12 in the tub enclosure 20, an outer shield box 24 provides sufficient space for the chuck 12 to be moved laterally by the positioner 22. Because the chuck 12 may freely move within the outer shield box 24, a suspended member 26 electrically interconnected to a guard potential may be readily positioned above the chuck 12. The suspended guard member 26 defines an opening that is aligned with the opening defined by the platen 18 so that the probe apparatus 16 may extend through the guard member 26 to probe the electrical device 14. When connected to a guard signal substantially identical to the test signal provided to the probe apparatus 16, the suspended guard member 26 provides additional guarding for low noise tests. Such a design is exemplified by EP 0 505 981 B1, incorporated by reference herein.

To provide a substantially closed environment, the outer shield box 24 includes a sliding plate assembly 28 that defines a portion of the lower perimeter of the shield box 24. The sliding plate assembly 28 comprises a number of overlapping plate members. Each plate member defines a central opening 30 through which the positioner 22 may extend. Each successively higher plate member is smaller in size and also defines a smaller opening 30 through which the positioner 22 extends. As shown in FIG. 2, the sliding plate assembly 28 is included to permit lateral movement of the positioner 22, and hence the chuck 12, while maintaining a substantially closed lower perimeter for the shield box 24.

One drawback of the probe station 11 depicted in FIG. 2 is that the large space enclosed by the outer shield box 24 results in some difficulty in efficient maintenance of a controlled environment within the outer shield box 24. Not only does more heat have to provided to or removed from the outer shield box 24 when testing an electrical device across a range of temperatures, but dry air ventilation must be provided to the shield box 24 in large quantities. The air currents generated by such a ventilation system may sometimes interfere with accurate measurements taken by the probe station 11.

What is desired, then, is a probe station that provides a quiet electrical environment surrounding the chuck and may readily maintain a controlled environment.

DETAILED DESCRIPTION OF THE PREFERRED EMBODIMENT

Referring again to FIG. 1, the probe station 10 having a chuck 12 that does not laterally move with respect to the tub enclosure 20 permits a small region immediately surrounding the chuck 12 to be enclosed. During testing the chuck 12 and enclosure 20 are moved laterally relative to the probes 16. The relatively small environment of the enclosure 20 facilitates efficient management of the environment within the enclosed region. The tub enclosure 20 defines an upper opening typically at least as large as the wafer including the electrical devices to be tested so that each electrical device may be successively positioned beneath the probing apparatus 16 by lateral movement of the chuck 12 and tub enclosure 20.

Referring to FIG. 2, the inclusion of a conductive member electrically connected to a guard potential vertically spaced above the chuck 12 of the probe station 10 provides for a quiet electrical environment surrounding the chuck 12, as exemplified in U.S. Pat. No. 5,266,889 and U.S. Pat. No. 5,345,120. However, the present inventors determined that the inclusion of a guard member 26 as shown in FIG. 2, into the structure shown in FIG. 1, would result in significant condensation in the wafer 14 region when testing the device under test at different ambient conditions, especially at cold temperatures. The condensation primarily results from movement of the enclosure 20 relative to such a guard member 26 with condensation thereon which is then brought within the environment with the wafer 14 by movement of the enclosure 20. In addition, with a guard member 26 suspended by the platen 118 of FIG. 1, the enclosure 20 can not be raised to form a sealed environment around the chuck 12, which increases electrical noise. The present inventors then came to the realization that by locating a conductive member across the opening of the enclosure 20 that moves together with the enclosure 20 eliminates the condensation resulting from the movement of the enclosure 20 relative to the conductive member and would likewise result in decreasing the noise in the signal by providing an improved guarding environment.

Figure 3:
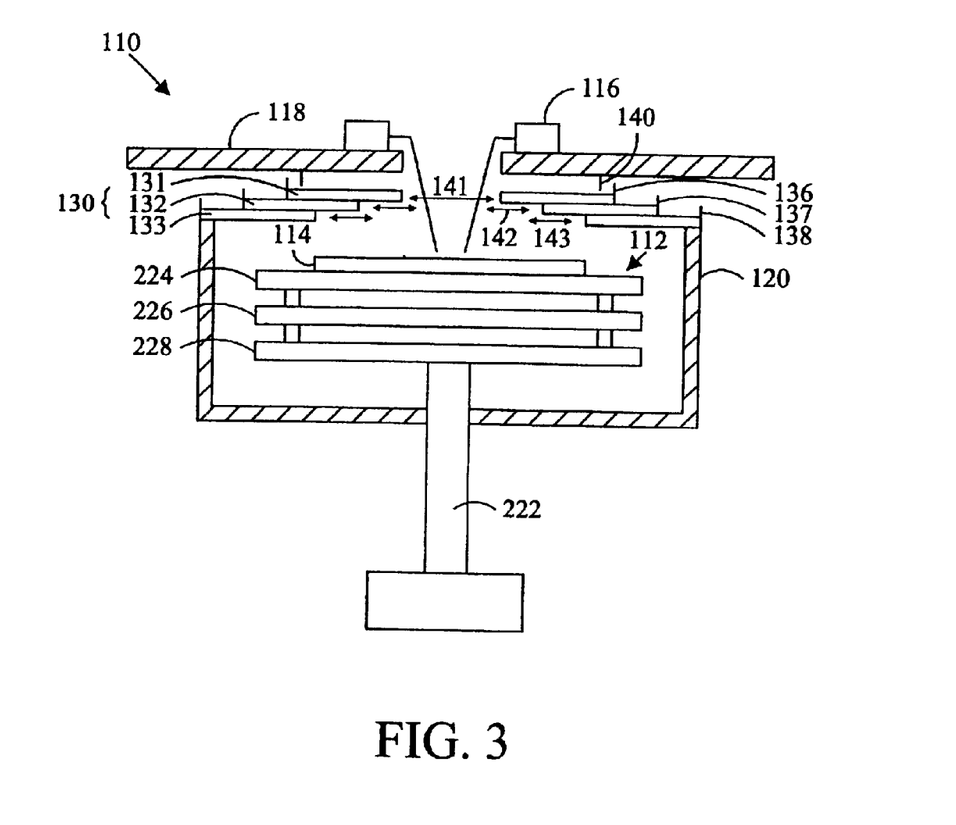
FIG. 3 shows a cross sectional view of a probe station that incorporates the present invention.

FIG. 3 shows a generalized schematic of a modified probe station 110. The probe station 110 includes a chuck 112 that supports an electrical device 114 to be probed by a probe apparatus 116 supported by a platen 118 located above the chuck 112. The platen 118 may be any structure suitable to support probes directly or indirectly. The chuck 112 is preferably fixedly and/or rigidly interconnected with a tub enclosure 120. Similarly, the design may be modified such that the chuck 112 and enclosure 120 have some limited relative movement with respect to one another. However, with such relative movement the enclosure 120 may still require some movement relative to the probes 116 to facilitate testing of an entire wafer approximately the same size as the chuck itself. The enclosure 120 may be non-conductive, or conductive. If the enclosure 120 is conductive it is preferably electrically connected to a guard signal, shield signal, ground signal, or floating. The tub enclosure 120 at least partially surrounds the chuck 112, and hence the electrical device 114. The probe station 110 includes an assembly 130 positioned above a chuck 112. The assembly 130 may be supported by the enclosure 120. The assembly 130 is preferably electrically insulated from the enclosure 120 if both are electrically conductive. The term "above" merely refers to a general direction apart from the chuck 112 and not in reference to "up" and "down" as referenced to the earth. Accordingly, much of the probe station may be "inverted" while still maintaining the "above" relationship. The assembly 130 is preferably conductive and may include a plurality of conductive plates 131, 132, and 133 that are slidably engaged with respect to one another. The conductive plates 131, 132, and 133 each define a respective opening 141, 142, and 143. Each of the conductive plates 131, 132, and 133 may include an upwardly extending circular ring 136, 137, and 138. An insulating ring 140 may be supported by the platen 118. The circular ring 136 is positioned at a location exterior to the insulating ring 140. When the circular ring 136 is preferably moved in a lateral direction it abuts the insulating ring 140 and inhibits further lateral movement in a particular direction of plate 131. At least a part of the opening 141 defined by the conductive plate 131 remains at least partially aligned with the opening defined by the platen 118. In other words, at least part of the opening 141 is spatially overlapping with the opening defined by the platen 118 during probing with the probe 116. Further movement of the enclosure 120 in the same lateral direction results in the circular rings 137 and 138 abutting respective conductive plates 131 and 132. In this manner, the respective openings 142 and 143 defined by the conductive plates 132 and 133 remains at least partially aligned with the opening defined by the platen 118. As it may be observed, the multiple conductive plate assembly 130 permits movement of the enclosure 120 and chuck 112 enclosed therein for probing the device under test 114 while maintaining a guarded conductive member over at least a portion of the device under test 114. The conductive plate assembly 130 may be connected to shield, ground, instrumentation ground, or floating. The conductive plate assembly 130 is also preferably electrically isolated from the enclosure 120 and/or the platen 118.

The central aperture of the assembly 130 maintains an opening that is at least partially overlapping with the opening in the platen. The assembly, may of course, be within the enclosure as opposed to above the enclosure. For example, the size of the opening may be such that it is less than 30%, 20%, or 10% of the size of the opening defined by the upright sides of the enclosure 120. Moreover, the size of the opening may be such that it is less than the size of the wafer 114 being tested, or less than 80%, 60%, or 40% the size of the wafer 114 being tested. Alternatively, the size of the opening may be such that it is less than 50%, 40%, or 30% of the size of the chuck 112 enclosed within the enclosure 120. The size of the opening is selected sufficiently large to permit the probes to be passed through for testing of the wafer thereunder and sufficiently small that the effect of the guarding is sufficiently improved to provide desirable noise levels. As can be seen in FIG. 3, the sliding plate assembly 130 permits lateral movement of the tub enclosure 120 during times when the probe apparatus 116 extends through the sliding plate assembly to probe the device to be tested 114 while nonetheless maintaining a substantially closed region surrounding the chuck 112. The environment in this closed region can therefore be more efficiently controlled.

The probe station 110 depicted in FIG. 3 is also suitable for high frequency, low current measurements. The multi-stage chuck 112 comprises a top stage 224, a center stage 226, and a lower stage 228, electrically insulated from one another. A positioner 222 extends through the lower periphery of the tub enclosure 120 to support the multistage chuck 112 and provide vertical and angular positioning of the chuck 112 relative to the tub enclosure as well as lateral x- and y-movement of the combination of the chuck 112 and the enclosure 120. The top stage 224 of the chuck 112 supports the electrical device 114 and routes any desired test signal. The center stage 226 of the chuck 112 is capable of routing a guard signal that may preferably approximate the test signal provided to the electrical device 114 and the lower stage 228 of the chuck 112 is capable of routing a shield signal of instrumentation ground or any other desired potential. For high frequency and/or low current measurements where it is desirable to provide additional guarding to eliminate electromagnetic noise, the member 130 is capable of routing the guard signal also provided to the center stage 226 of the chuck 112.

Figure 3A:
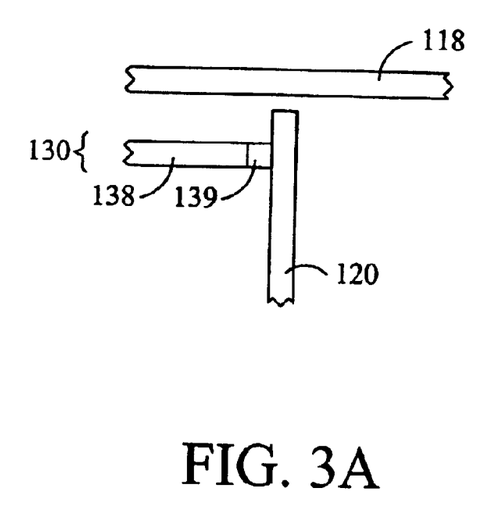
FIG. 3A illustrates an alternative structure from that shown in FIG. 3.

In one embodiment shown in FIG. 3A, the enclosure 120 may extend above the plate assembly 130. The plate assembly 130 is supported by the enclosure 120 by an insulator 139. The enclosure 120 may be raised prior to testing to make electrical interconnection between the enclosure 120 and the platen 118.

Figure 4:
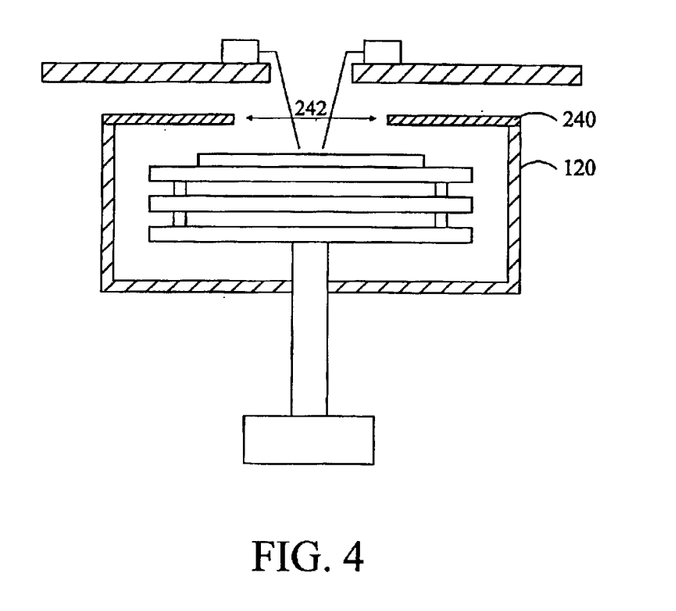
FIG. 4 shows a cross sectional view of another probe station that incorporates the present invention.

Referring to FIG. 4, the plate assembly may comprise a conductive member 240 with an opening 242 defined therein. The opening 242, unlike the opening defined by the plate assembly 130, does not move with respect to the enclosure 120. The elimination of the movable portions of the plate assembly 130 reduces mechanical complexity and potential sources of mechanical failure.

Figure 5:
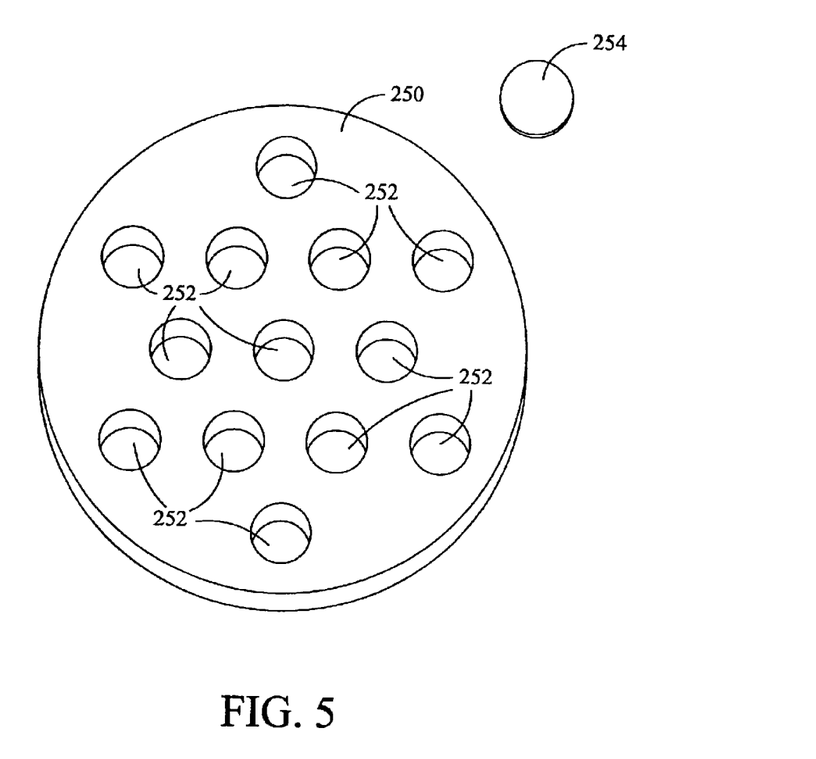
FIG. 5 shows a top view of a guarded member.

Referring to FIG. 5, the plate assembly may comprise a conductive member 250 with a plurality of openings 252 defined therein. One or more probes may be placed through one or more of the openings 252. The inclusion of a plurality of openings 252 permits probing of different regions of the wafer simultaneously that may not otherwise be accessible with a single opening. In addition, one or more conductive plates 254 may be placed over the unused openings to provide improved guarding/shielding and environmental enclosure. The chuck 112 may have some relative movement with respect to the conductive member 250 to assist the alignment of probes passing through the openings 252.

Figure 6:
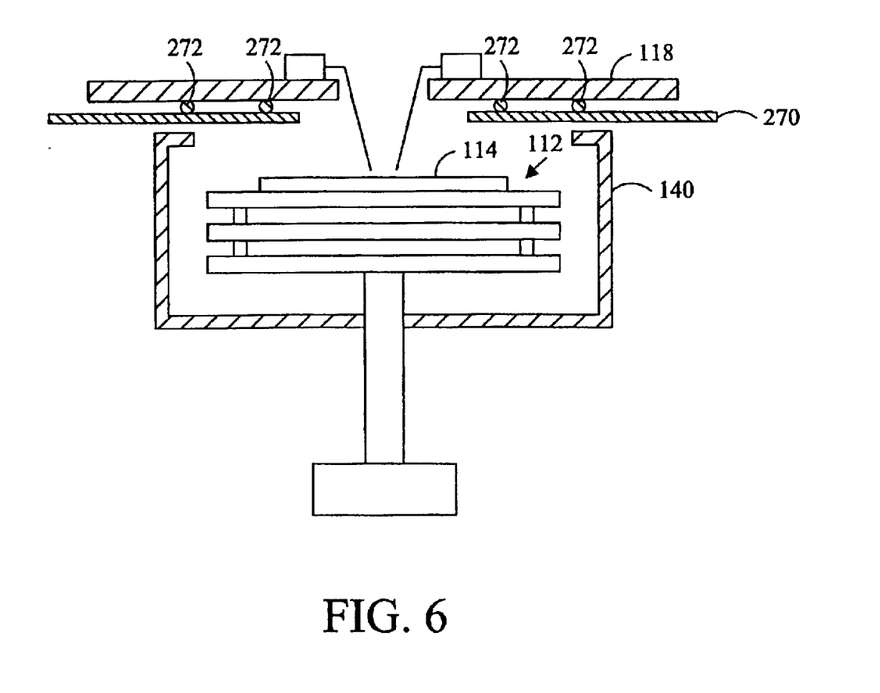
FIG. 6 shows a cross sectional view of another probe station that incorporates the present invention.

Referring to FIG. 6, the plate assembly may comprise a conductive member 270 may be supported by the platen 118 or otherwise free from being supported by the enclosure 140. The conductive member 270 may be movably engaged and/or slidably engaged with the platen 118 (or otherwise) such that the conductive member 270 is movable with respect to the platen 118. The movable engagement and/or slidable engagement may be provided by a roller based mechanism 272 or any other suitable mechanism. As the enclosure 140 and/or the chuck 112 is moved to reposition the probes for testing the wafer 114, the conductive member 270 is likewise repositioned. Preferably, the enclosure 140, chuck 112, and conductive member 270 are simultaneously moved laterally such that the portion of surface of the conductive member 270 opposing the enclosure 140 remains substantially unchanged. In this manner, during repositing of the enclosure 140 and/or chuck 112 different portions of the conductive member 270 will not come within the enclosure 140. This limits the amount of moisture that comes into the enclosure 140 with the wafer 114 as a result of relative movement of the conductive member 270 and the enclosure 140.

Figure 6A:
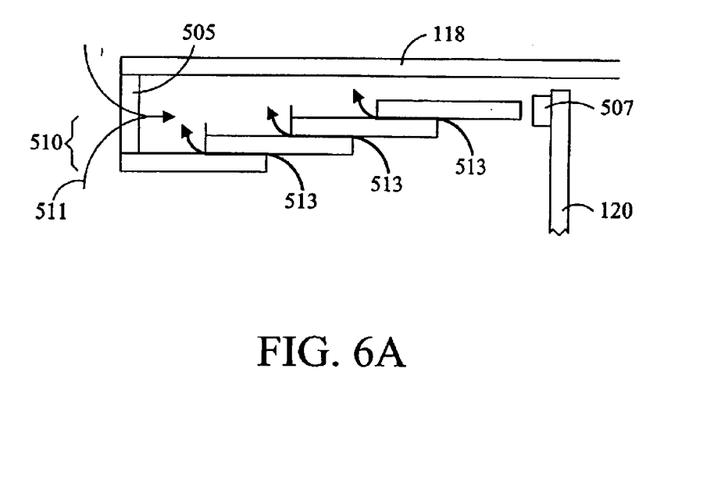
FIG. 6A shows an alternative structure from that shown in FIG. 6.

Referring to FIG. 6A, a plate assembly 510 may be supported by the platen 118 with a support 505. The plate assembly 510 may include multiple slidably engaged plates. The enclosure 120 may include a bumper 507. Movement of the enclosure 120 results in movement of the plate assembly 510 while maintaining the plate assembly 510 with the enclosure 120. The plate assembly 510, the support 505, the enclosure 120, the bumper 507 may be conductive or non-conductive, as desired, and interconnected to any suitable signal or potential. The air flow from within the enclosure 120 may flow above the plate assembly 510 (as shown by lines 511) and/or between the plates of the plate assembly 510 (as shown by lines 513). The air flow will tend to remove condensation from the region between the plate assembly 510 and the platen 118.

Figure 7:
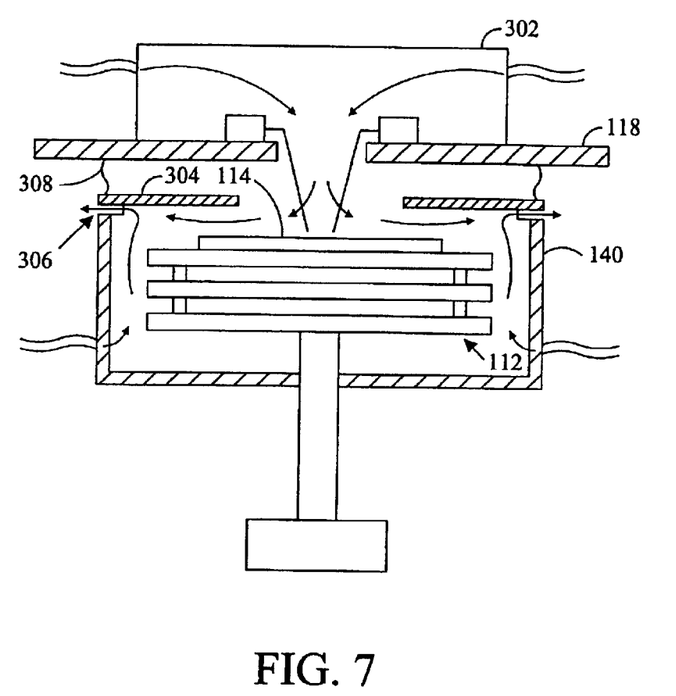
FIG. 7 shows a cross sectional view of another probe station that incorporates the present invention.

Referring to FIG. 7, the enclosure 140 and conductive assembly 304 spaced between the probing devices and the wafer 114 may include a top hat 302 thereon. The top hat 302 encloses at least a portion of the probes 116 and provides an air tight seal or otherwise a substantially air tight seal. In this manner, gaseous material, such as air, may be provided to the enclosure 140 and/or within the top hat 302 for probing. The gas flow will tend not to flow out though the platen 118 because the top hat 302 provides a substantially air tight seal and a majority of the gas flow will therefore tend to flow out an opening 306 (or a plurality of openings) between the sides of the enclosure 140 and the conductive assembly 304. The gas flow out the opening 306 has a tendency to purge undesirable moisture from the enclosure 140. Also, the gas flow out of the opening 306 likewise tends to reduce the air flow across the probes 116 which avoids unnecessary vibrations imposed on the probes 116. Similarly, the air may pass through one or more openings in the enclosure 140. Likewise, a seal 308 or other structure may be provided between the conductive assembly 304 and the platen 118 to substantially inhibit air from within the enclosure 140 to the exterior of the enclosure 140 in this region.

Figure 8:
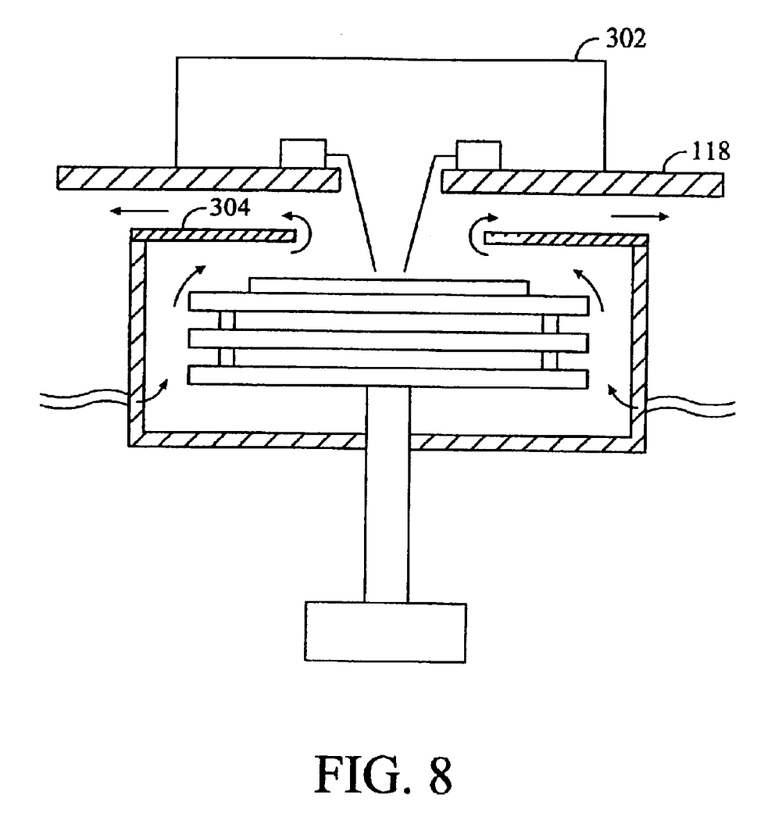
FIG. 8 shows a cross sectional view of another probe station that incorporates the present invention.

Referring to FIG. 8, an alternative structure includes an opening between the conductive assembly 304 and the platen 118, together with a top hat 302, such that the major portion of the gas exiting the enclosure 140 passes between the conductive assembly 304 and the platen 118. The gas will not tend to flow out through the platen 118 because the top hat 302 forms a substantially air tight seal.

Figure 9:
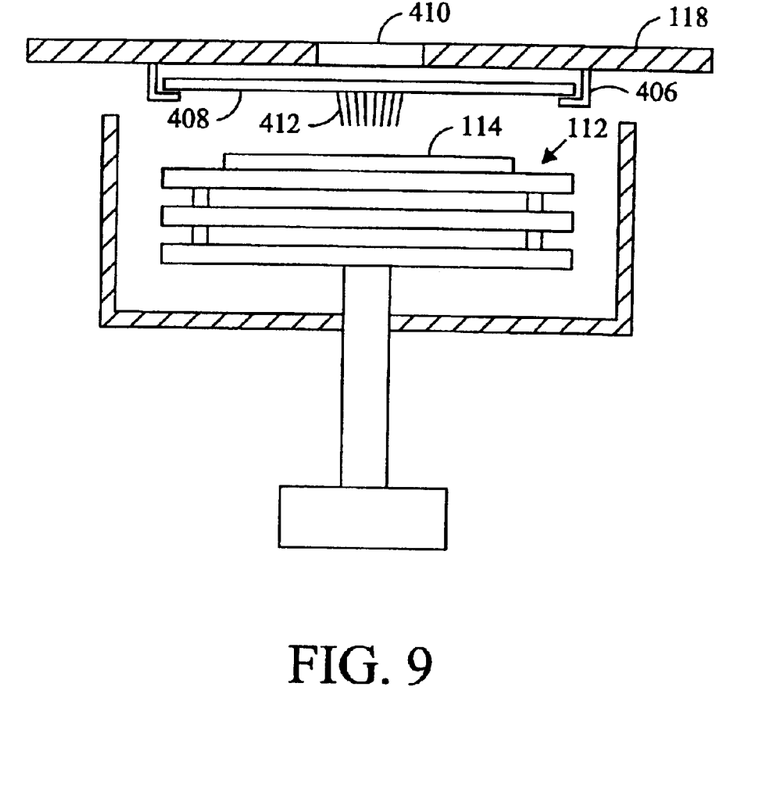
FIG. 9 shows a cross sectional view of another probe station that incorporates the present invention.

Referring to FIG. 9, another structure for a probe station includes a supporting structure 406 for a probe card 408. The probe card 408 supports a plurality of probe needles 412 that extend below the probe card 408. The probe needles 412 contact the wafer 114 for testing. The platen 118 is preferably a solid structure that prevents the passage of air through. In addition, the platen 118 may include a region 410 that is optically transparent. The transparent region 410 permits viewing of the probe needles 412 and the wafer 114 so that proper alignment of the probe needles 412 may be achieved using an exterior microscope.

Another potential probe station design would include the incorporation of the suspended guard member, as illustrated in FIG. 2, together with the moving "tub" enclosure as described herein. Such a design is may be most beneficial when the temperature range of testing is minimal or otherwise the condensation may be controlled. In addition, by providing air flow out of the "tub" across the lower surface of the suspended guarded member the condensation may be minimized.

Referring again to FIG. 6A, to load a wafer the enclosure 120 and chuck may be lowered below the conductive plate assembly. Then the enclosure 120 may be offset from the platen 118 to make loading the wafer easier. Thereafter, the enclosure 120 is raised back to its position with the conductive plate assembly. Alternatively, the lower portion of the enclosure 120 may be opened to permit the chuck therein to be lowered and raised with respect to the enclosure 120 to permit loading of a wafer.

Referring again to FIG. 3, the plate assembly 130 may be suspended from the platen 118 and the enclosure 120 together with the chuck lowered. Then the enclosure 120 may be offset from the platen 118 to make loading the wafer easier. Thereafter, the enclosure 120 is raised back to its position with the conductive plate assembly. Alternatively, the lower portion of the enclosure 120 may be opened to permit the chuck therein to be lowered and raised with respect to the enclosure 120 to permit loading of a wafer.

The terms and expressions which have been employed in the foregoing specification are used therein as terms of description and not of limitation, and there is no intention, in the use of such terms and expressions, of excluding equivalents of the features shown and described or portions thereof, it being recognized that the scope of the invention is defined and limited only by the claims which follow.

What is claimed is:

1. A probe station comprising:
    (a) a platen suitable for supporting a probe for testing a device under test;
    (b) a support having a surface area suitable for supporting said device under test thereon;
    (c) a conductive member vertically spaced above at least 50 percent of said surface area of said support; and
    (d) said support maintaining a fixed relationship with respect to at least a portion of said conductive member when said support is moved laterally with respect to said platen.

2. The probe station of claim 1 wherein said conductive member is vertically spaced above at least 60 percent of said surface area of said support.

3. The probe station of claim 1 wherein said conductive member is vertically spaced above at least 70 percent of said surface area of said support.

4. The probe station of claim 1 where said conductive member defines a central aperture.

5. The probe station of claim 1 where said conductive member comprises a plurality of slidably overlapping plates.

6. The probe station of claim 1 further comprising an enclosure defining an opening at least partially surrounding said support.

7. The probe station of claim 6 wherein said conductive member encompasses at least 70 percent of said opening.

8. The probe station of claim 6 wherein said conductive member encompasses at least 80 percent of said opening.

9. The probe station of claim 6 wherein said conductive member encompasses at least 90 percent of said opening.

10. A probe station comprising:
    (a) a platen suitable far supporting a probe for testing a device under test;
    (b) a support having a surface area suitable for supporting said device under test thereon;
    (c) an enclosure at least partially surrounding said support defining an opening;
    (d) a conductive member encompasses at least 70 percent of said opening; and
    (e) said conductive member being supported by said enclosure such that at least a portion of said conductive member moves horizontally with respect to said platten when said support is moved horizontally with respect to said platten.

11. The probe station of claim 10 wherein said conductive member encompasses at least 80 percent of said opening.

12. The probe station of claim 10 wherein said conductive member encompasses at least 90 percent of said opening.

13. The probe station of claim 10 wherein said conductive member is vertically spaced above at least 50 percent of said surface area of said support.

14. The probe station of claim 10 wherein said support maintains a fixed relationship with respect to said conductive member when said support is moved laterally with rasped to said platen.

15. The probe station of claim 10 wherein said conductive member is vertically spaced above at least 60 percent of said surface area of said support.

16. The probe station of claim 15 wherein said conductive member is vertically spaced above at least 70 percent of said surface area of said support.

17. The probe station of claim 10 where said conductive member defines an aperture.

18. The probe station of claim 10 where said conductive member comprises a plurality of slidably overlapping plates.

19. A probe station comprising:
    (a) a platen suitable for supporting a probe for testing a device under test;
    (b) a chuck suitable for supporting said device under test thereon;
    (c) an enclosure at least partially surrounding said support, wherein said enclosure defines an upper opening;
    (d) a conductive member supported by said enclosure that encompasses at least 70 percent of said opening;
    (e) the combination of said conductive member and said chuck laterally movable with respect to said platen while at least a portion of said conductive member and said chuck, maintain a fixed relationship with respect to one another; and
    (f) said conductive member defining an opening therein through which said probe extends to test said device under test.

20. A probe station comprising:
    (a) a platen suitable for supporting a probe for testing a device under test;
    (b) a support having a surface area suitable for supporting said device under test thereon;
    (c) a conductive member vertically spaced above at least 50 percent of said surface area of said support;
    (d) said support maintaining a fixed relationship with respect to at least a portion of said conductive member when said support is moved laterally with respect to said platen; and
    (e) said conductive member comprises a plurality of slidably overlapping plates.

21. A probe station comprising:
    (a) a platen suitable for supporting a probe for testing a device under test;
    (b) a support having a surface area suitable for supporting said device under test thereon;
    (c) an enclosure at least partially surrounding said support defining an opening;
    (d) a conductive member encompasses at least 70 percent of said opening;
    (e) said conductive member being supported by said enclosure; and
    (f) said conductive member comprises a plurality of slidably overlapping plates.

* * * * *

UNITED STATES PATENT AND TRADEMARK OFFICE
CERTIFICATE OF CORRECTION

PATENT NO. : 6,861,856 B2
DATED : March 1, 2005
INVENTOR(S) : John Dunklee et al.

It is certified that error appears in the above-identified patent and that said Letters Patent is hereby corrected as shown below:

Column 2,
Line 48, change "have to provided" to -- have to be provided --.

Column 6,
Line 5, change "the enclosure. 120 results" to -- the enclosure 120 results --.

Column 7,
Line 52, change "a platen suitable far supporting" to -- a platen suitable for supporting --.

Signed and Sealed this

Third Day of January, 2006

JON W. DUDAS
*Director of the United States Patent and Trademark Office*